United States Patent
Kumar et al.

(10) Patent No.: US 7,125,792 B2
(45) Date of Patent: Oct. 24, 2006

(54) DUAL DAMASCENE STRUCTURE AND METHOD

(75) Inventors: Kaushik Kumar, Beacon, NY (US); Douglas C. La Tulipe, Danbury, CT (US); Timothy Dalton, Ridgefield, CT (US); Larry Clevenger, LaGrangeville, NY (US); Andy Cowley, Wappingers Falls, NY (US); Erdem Kaltalioglu, Hsin-Chu (TW); Jochen Schacht, Hsin-Chu (TW)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 197 days.

(21) Appl. No.: 10/685,055

(22) Filed: Oct. 14, 2003

(65) Prior Publication Data
US 2005/0079706 A1    Apr. 14, 2005

(51) Int. Cl.
*H01L 21/4763* (2006.01)
(52) U.S. Cl. .................................. 438/637; 438/618
(58) Field of Classification Search .............. 438/618, 438/637
See application file for complete search history.

(56) References Cited

U.S. PATENT DOCUMENTS

| 6,071,809 | A   |   | 6/2000  | Zhao         |        |
|-----------|-----|---|---------|--------------|--------|
| 6,197,123 | B1  | * | 3/2001  | Poag et al.  | 134/18 |
| 6,479,380 | B1  |   | 11/2002 | Furusawa et al. |     |
| 6,599,830 | B1  |   | 7/2003  | Furusawa et al. |     |
| 6,605,874 | B1  |   | 8/2003  | Leu et al.   |        |
| 6,759,321 | B1  |   | 7/2004  | Babich et al. |       |
| 6,787,875 | B1  |   | 9/2004  | Brennan et al. |      |
| 2002/0074312 | A1 | * | 6/2002 | Ou-Yang et al. | 216/39 |
| 2002/0164889 | A1 | * | 11/2002 | Tsai et al. | 438/763 |
| 2003/0044725 | A1 | * | 3/2003 | Hsue et al. | 430/314 |
| 2003/0054656 | A1 | * | 3/2003 | Soda | 438/710 |
| 2003/0119307 | A1 | * | 6/2003 | Bekiaris et al. | 438/638 |
| 2004/0026364 | A1 | * | 2/2004 | Kihara et al. | 216/20 |

FOREIGN PATENT DOCUMENTS

JP    2002-124568    *   4/2002

OTHER PUBLICATIONS

Applied Materials' data sheet for Black Diamond(TM), printout from internet, two pages.*
S. Wolf and R.N. Tauber, Silicon Processing for the VLSI Era, vol. 1, Second Edition, Lattice Press, 2000, p. 524.*

* cited by examiner

*Primary Examiner*—Carl Whitehead, Jr.
*Assistant Examiner*—Heather Doty
(74) *Attorney, Agent, or Firm*—Slater & Matsil, L.L.P.

(57) ABSTRACT

A dual damascene structure and method of fabrication thereof. An insulating layer comprises a first dielectric material and a second dielectric material, the second dielectric material being different from the first dielectric material. First conductive regions having a first pattern are formed in the first dielectric material, and second conductive regions having a second pattern are formed in the second dielectric material, the second pattern being different from the first pattern. One of the first dielectric material and the second dielectric material comprises an organic material, and the other dielectric material comprises an inorganic material. One of the first and second dielectric materials is etchable selective to the other dielectric material. A method of cleaning a semiconductor wafer processing chamber while a wafer remains residing within the chamber is also disclosed.

24 Claims, 5 Drawing Sheets

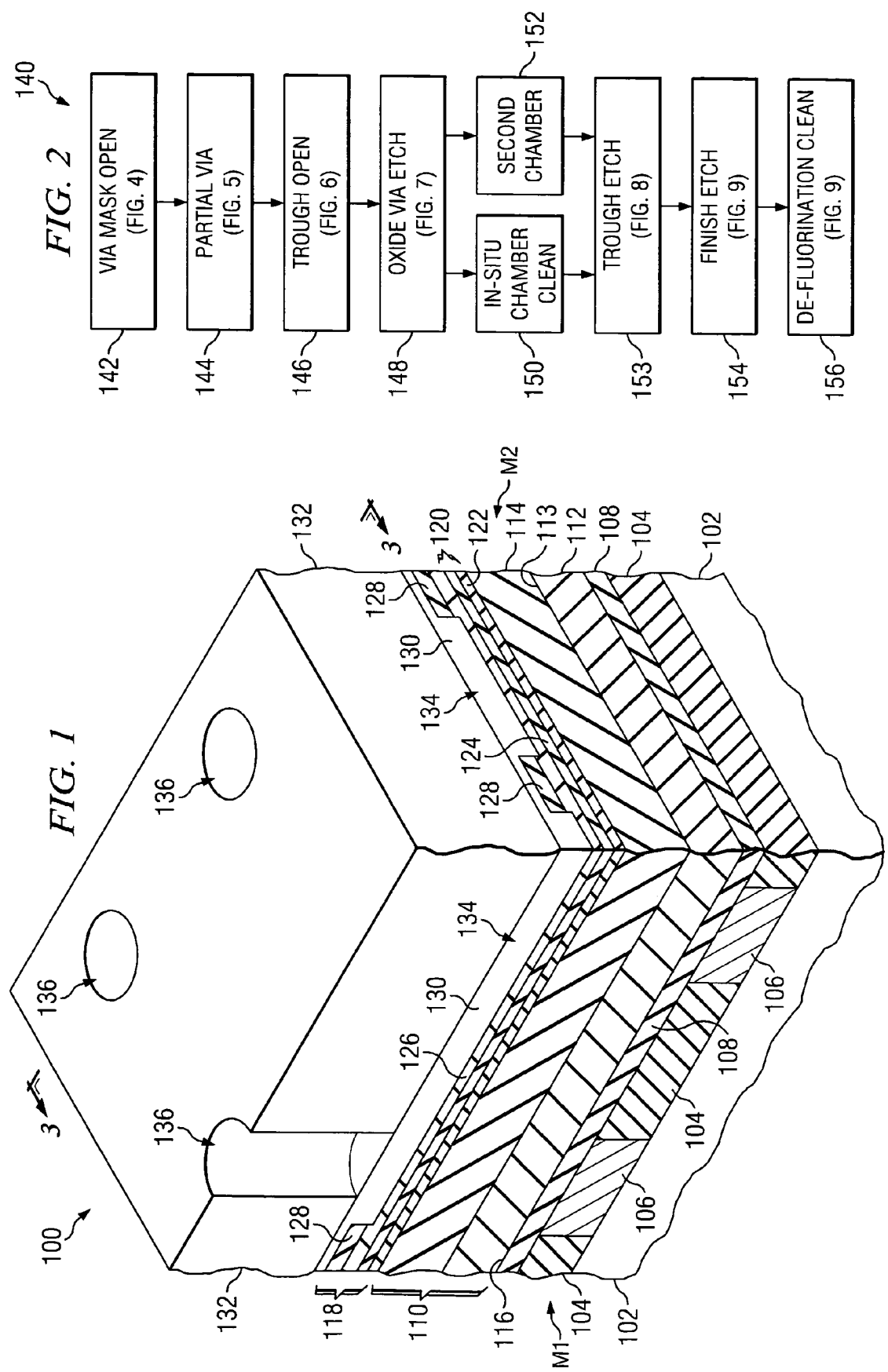

DUAL DAMASCENE STRUCTURE AND METHOD

CROSS-REFERENCE TO RELATED APPLICATIONS

This application relates to the following co-pending and commonly assigned patent applications: Ser. No. 10/684,952, filed concurrently herewith, entitled Dual Damascene Structure and Method, which application is hereby incorporated herein by reference.

TECHNICAL FIELD

The present invention relates generally to the fabrication of semiconductor devices, and more particularly to the fabrication of a dual damascene structure.

BACKGROUND

Semiconductor devices are fabricated by sequentially depositing insulating (or dielectric) layers, conductive layers and semiconductive layers of material over a semiconductor substrate, and patterning the various layers using lithography to form circuit components and elements thereon. A common conductive material used in the past for conductive lines was aluminum, which can be directly etched. For example, a layer of aluminum or aluminum alloy is deposited, a photoresist layer is deposited over the aluminum, the photoresist is patterned and developed, and the photoresist is used as a mask while exposed areas of the aluminum layer are etched away.

There is a trend in the semiconductor industry towards the use of copper for conductive lines and metallization layers. Copper introduces new challenges in semiconductor device fabrication. While copper is more conductive than aluminum, which is an advantage, it has a tendency to diffuse through dielectric layers, causing shorts and device failures. Therefore, liners are used to prevent this diffusion. Also, copper cannot be directly etched, particularly in small minimum feature sizes, which leads to the use of damascene methods to form copper conductive lines.

In a damascene method of forming conductive lines, an insulating layer is deposited over a semiconductor substrate, and the insulating layer is patterned, e.g. by depositing a photoresist, patterning and developing the photoresist, and using the photoresist as a mask for the insulating layer while exposed portions of the insulating layer are etched away. A conductive material (such as copper) is deposited over the patterned insulating layer, e.g. by chemical vapor deposition (CVD), electroplating or electro-less plating, or other deposition methods. The semiconductor substrate is chemically-mechanically polished (CMP) to remove excess conductive material from over the top surface of the insulating layer, leaving conductive lines or regions formed in the insulating layer.

If one pattern is formed in the insulating layer, the process is referred to as a single damascene process. However, two patterns may also be formed in the insulating layer, with one pattern typically being etched deeper into the insulating layer than the other pattern. The two pattern process is referred to in the art as a dual damascene process. A dual damascene process may be used to form a first layer of vias to connect to underlying conductive lines or elements, for example, and a second layer of conductive lines or regions may be formed over the vias.

In the prior art, typically either the vias are first patterned in the insulating layer through the entire thickness of the insulating layer, and then the conductive lines are patterned in a top portion of the insulating layer, often referred to as a "via-first" dual damascene patterning method. Or, the conductive lines may alternatively be patterned in a top portion of the insulating layer first, followed by the patterning of the vias through the entire thickness of the insulating layer, called a "line-first" dual damascene method.

As semiconductor device sizes decrease and the minimum feature size of the electrical components and conductive lines decrease, patterning an insulating layer in a dual damascene process becomes more and more difficult. In a dual damascene patterning process, one of the patterning steps etches through the entire thickness of the insulating layer (forming the vias, for example), and the other patterning step etches only through part of the insulating layer (forming the conductive lines), using a timed etch, for example. There is a trend in the semiconductor industry towards the use of low-dielectric constant (low-k) dielectric materials, particularly used in conjunction with copper conductive lines, to reduce the RC time delay of the conductive lines. Some low-k dielectric materials are porous and/or etch very quickly, and it can be difficult to adequately control the etch process, particularly in a dual damascene structure and process.

Another problem in dual damascene patterning is photoresist poisoning, which can occur during a patterning process when etch chemistries containing nitrogen are used to pattern insulating layers comprising SiCOH-type (materials containing silicon, carbon, oxygen, and/or hydrogen) materials, which are often used as insulators. The nitrogen-containing etch chemistries, in conjunction with the SiCOH-type materials, liberate amines that can interact with or migrate into the photoresist during a subsequent lithography step. Photoresist poisoning causes depth of focus problems and/or delamination of the photoresist, resulting in loss of control of the critical dimensions and the inability to print, which leads to device failures and decreased yields. Photoresist poisoning tends to be a problem in via-first dual damascene patterning methods and also in line-first dual damascene patterning methods because the subsequent application of photoresist is exposed to the amines generated during the previous etch process.

Therefore, what is needed in the art is a dual damascene structure and method with improved control of patterning a damascene structure that avoids photoresist poisoning.

SUMMARY OF THE INVENTION

Embodiments of the present invention solve these problems by providing a novel partial-via dual damascene structure and method. The dual damascene insulating layer includes a first insulating material having a first etch selectivity and a second insulating material having a second etch selectivity. Because the first etch selectivity is different from the second etch selectivity, the first and second insulating materials may be etched selective to one another, providing improved control for the dual damascene etch process.

In accordance with a preferred embodiment of the present invention, a method of fabricating a semiconductor device includes providing a workpiece, disposing a first dielectric material over the workpiece, and disposing a second dielectric material over the first dielectric material. The second dielectric material comprises a different material than the first dielectric material, wherein the first dielectric material and the second dielectric material comprise a first insulating layer. A first pattern is formed in the first dielectric material and a second pattern is formed in the second dielectric material, the second pattern being different from the first pattern.

In accordance with another preferred embodiment of the present invention, a method of fabricating a semiconductor device includes providing a workpiece, forming a first insulating layer over the workpiece, forming a plurality of first conductive lines in the first insulating layer, disposing a first dielectric material over the first insulating layer, and disposing a second dielectric material over the first dielectric material. The second dielectric material comprises a different material than the first dielectric material, and the first dielectric material and the second dielectric material comprise a second insulating layer. The method includes forming a first pattern in the first dielectric material and a second pattern in the second dielectric material, the second pattern being different from the first pattern. A conductive material is deposited over the patterned second dielectric material and the patterned first dielectric material. The conductive material is removed from the top surface of the second dielectric material to form a plurality of second conductive lines in the second pattern of the second dielectric material and a plurality of vias in the first pattern of the first dielectric material.

Yet another preferred embodiment of the present invention is a method of cleaning a chamber that has been used to etch inorganic materials in semiconductor device fabrication, the chamber having polymer build-up on the interior walls thereof. The method includes introducing a plasma cleaning gas into the chamber to remove the polymer build-up on the chamber walls, without removing the semiconductor wafer that has been processed in the chamber and without etching a material layer of the semiconductor wafer.

Advantages of preferred embodiments of the present invention include providing a dual damascene hybrid dielectric stack having natural etch stops and enhanced reactive ion etch (RIE) profiles. The bottom layer of the hard mask is tunable for a particular application as a chemical-mechanical polish (CMP) stop layer. Photoresist poisoning during a dual damascene etch process is prevented with the use of embodiments of the present invention. The materials used in the various layers of the structure may be changed without impacting or affecting the remainder of the stack. Vias with substantially vertical sidewalls and smaller critical dimensions are achievable using embodiments of the present invention.

Advantages of a method of forming a dual damascene structure according to an embodiment of the present invention include providing a dual damascene etch process that enables a dual damascene integration scheme. Modifications may be made to a specific component of the etch process to account for a material change in the via patterning etch process or the line patterning etch process, which does not affect the remainder of the etch scheme. The need for a timed etch to pattern the shallower conductive line pattern, which is difficult to control, is eliminated. The dual damascene process may be completed in a single chamber or alternatively in multiple chambers. A novel method of cleaning a chamber while the wafer remains in the chamber is also disclosed.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 shows a perspective view of a hybrid dielectric stack that will be patterned using a dual damascene method in accordance with an embodiment of the present invention, wherein the insulating layer to be patterned comprises a bi-layer of two different dielectric materials;

FIG. 2 is a flow chart for patterning a semiconductor device using the dual damascene method described herein;

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 3:
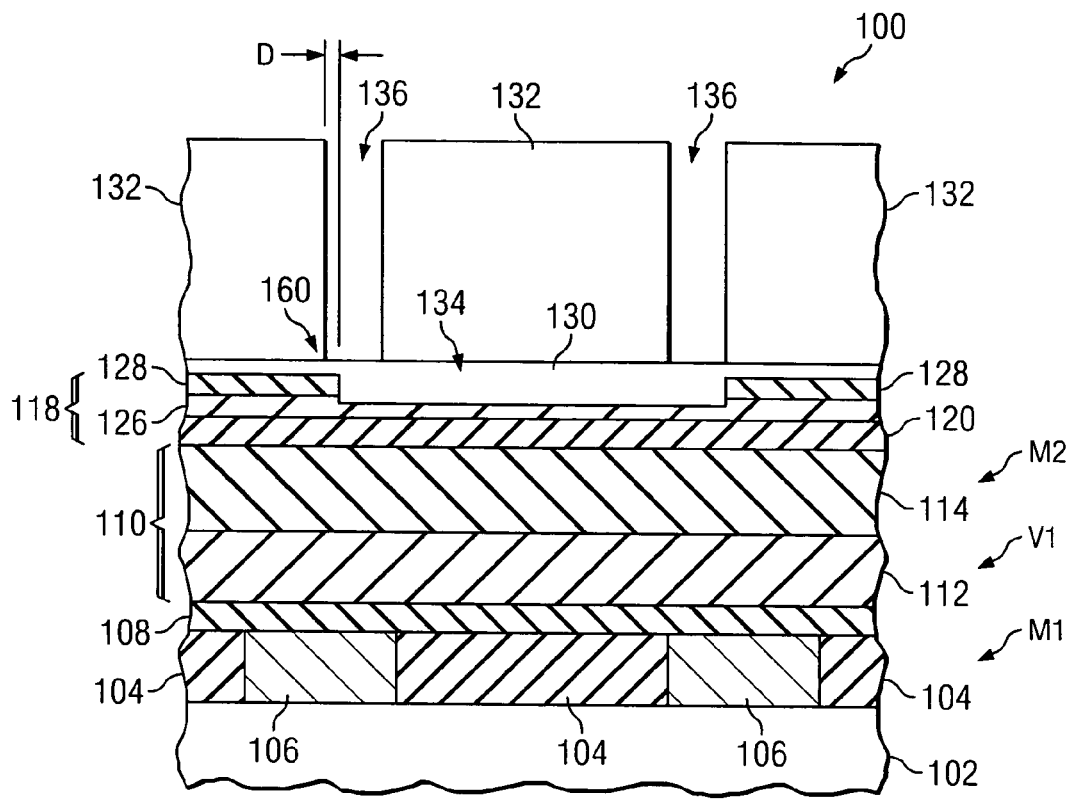
FIGS. 3 through 10 show cross-sectional views of a semiconductor device at various stages of manufacturing in accordance with a dual damascene patterning method of an embodiment of the present invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIG. 1 shows a perspective view of a dielectric stack 100 in which a dual damascene structure will be fabricated in accordance with an embodiment of the present invention, wherein an insulating layer 110 to be patterned using a dual damascene process comprises a bi-layer of dielectric materials 112 and 114. A first insulating layer 104 which may comprise silicon dioxide or low-dielectric constant materials, for example, is deposited over a workpiece 102. The workpiece may include a semiconductor substrate comprising silicon or other semiconductor materials covered by an insulating layer, for example. The workpiece may also include other active components or circuits, not shown. The workpiece may comprise silicon oxide over single-crystal silicon, for example. The workpiece may include other conductive layers or other semiconductor elements, e.g. transistors, diodes, etc. Compound semiconductors, GaAs, InP, Si/Ge, or SiC, as examples, may be used in place of silicon.

A plurality of first conductive lines 106 are formed in the first insulating layer 104, for example, in a single damascene process. Alternatively, the first conductive lines 106 may be formed using a subtractive etch process, followed by depositing the first insulating layer 104 over the patterned first conductive lines 106, for example. The first conductive lines 106 may comprise copper, a copper alloy, or other conductive materials, for example, and may include a liner formed over the patterned first insulating layer 104 to prevent diffusion of a metal such as copper into the first insulating layer 104, for example, not shown. The thickness of the first conductive lines 106 and the first insulating layer 104 may range from about 500 to 3000 Angstroms, as an example. The first conductive lines 106 may be formed in a first metallization layer M1 of the semiconductor device, for example.

A cap layer 108 is deposited over the patterned first insulating layer 104 and the first conductive lines 106. The cap layer 108 comprises a copper cap that preferably functions as both a copper barrier, to prevent copper from diffusing or migrating into subsequently formed insulating layers (such as 112), and as an oxygen barrier, to prevent exposing the copper conductive lines 106 to oxygen in subsequent deposition and etch processes, which can cause corrosion. The cap layer 108 preferably comprises silicon nitride ($Si_xN_y$) or nitrogen-doped silicon carbide (N—$SiC_x$), as examples, although alternatively, the cap layer 108 may also comprise other insulating materials, for example. The cap layer may alternatively comprise $SiC_x$, $SiC_xH_y$, $SiCOH_x$, $SiC_xN_yH_z$ or $SiN_xH_y$, as examples.

Preferably, the material of the cap layer 108 is selected to have a transparent effect on unit processes such as RIE. For example, from a RIE perspective, a similar etch chemistry may be used to etch either $Si_3N_4$ or N—$SiC_x$; thus, these two materials may be used interchangeably in embodiments of the present invention without impacting the entire processing flow of the structure 100. The cap layer may comprise a thickness of about 150 to 500 Angstroms, for example.

An optional adhesion film 116 may be formed on a top surface of the cap layer 108. The adhesion film 116 functions as an adhesion promoter for subsequently deposited first dielectric material 112. The adhesion film 116 may comprise AP6000™ manufactured by Dow Chemical Company or HOSP-BEST™ manufactured by Honeywell, Inc., as examples, although the adhesion film 116 may alternatively comprise other adhesion promoting materials. The adhesion film 116 may be deposited by CVD or a spin-on process, as examples. The adhesion film 116 may comprise a thickness of less than about 100 Angstroms, as an example.

A second insulating layer 110 formed over the cap layer 108 comprises a bi-layer including a first dielectric material 112 and a second dielectric material 114, wherein the second dielectric material 114 preferably is etchable selective to the first dielectric material 112 in a dual damascene patterning process. To form the second insulating layer 110, a first dielectric material 112 is deposited over the cap layer 108 or optional adhesion film 116. The first dielectric material 112 preferably comprises an inorganic dielectric material such as $SiO_2$, undoped silicate glass (USG), fluorinated silicon glass (FSG), fluorinated tetraethoxysilate (FTEOS), SiCOH, or porous-SiCOH, as examples. The first dielectric material 112 may be spun-on, or may be deposited by CVD, as examples. In one embodiment, the cap layer 108 may be treated with a plasma pre-treatment of the cap layer 108 prior to the CVD process. The plasma pre-treatment excites the surface of the cap layer 108 so that the CVD dielectric material 112 will deposit onto a dangling bond attraction. The first dielectric material 112 may comprise a thickness of about 500 to 3000 Angstroms, for example.

The first dielectric material 112 comprises the portion of the second insulating layer 110 in which vias will be formed, in a dual damascene method. Thus, the first dielectric material 112 comprises a via dielectric material or via insulating layer. If the first conductive lines 106 comprise copper, preferably, the first dielectric material 114 comprises a material having a coefficient of thermal expansion (CTE) that is close to the CTE of copper, or the CTE of the first conductive lines 106, to prevent shearing or breaks in the electrical connection of the via to underlying first conductive lines over temperature-induced stress.

In one embodiment, the first dielectric material preferably comprises a material having a low dielectric constant (e.g., having a dielectric constant k of 4.0 or less). For example, $SiO_2$ typically has a k of about 4.0, FSG typically has a k of about 3.6, FTEOS typically has a k of about 3.5, SiCOH typically has a k range of about 2.6–3.3, and porous-SiCOH typically has a k range of less than 3.0.

One advantage of these selections of materials for the first dielectric material 112 is that typically, each material listed above may be etched by similar etch chemistries. For example, a RIE using a fluorocarbon-based chemistry ($CH_xF_y$) may be used to etch all of the possible materials that may be used for the first dielectric material 112 described herein. This is advantageous in that these materials may be interchanged in the material stack without having to modify etch processing parameters of the dual damascene integration scheme. Also, in one embodiment, these materials are selected so that they may be etched selective to the cap layer 108.

An optional adhesion film 113 may be formed on a top surface of the first dielectric material 112. The adhesion film 113 functions as an adhesion promoter for subsequently deposited second dielectric material 114. The adhesion film 113 may comprise AP6000™ manufactured by Dow Chemical Company or HOSP-BEST™ manufactured by Honeywell, Inc., as examples, although the adhesion film 113 may alternatively comprise other adhesion promoting materials. The adhesion film 113 may be deposited by CVD or a spin-on process, as examples. The adhesion film 113 may comprise a thickness of less than about 100 Angstroms, as an example.

The second insulating layer 110 includes a second dielectric material 114 deposited over the first dielectric material 112. The second dielectric material 114 preferably comprises an organic dielectric material such as SiLK™ or porous-SiLK™ manufactured by Dow Chemical Company, as examples. The second dielectric material 114 may be spun-on, or may be deposited by CVD, as examples. The second dielectric material 114 may comprise a thickness of about 500 to 3000 Angstroms, for example.

Advantageously, the CTE of the second dielectric material 114 does not have to closely match the CTE of the first conductive lines. Therefore, an organic material can be used. The second dielectric material 114 preferably comprises a low-k dielectric material. For example, SiLK™ typically has a k of about 2.6 and porous-SiLK™ typically has a k of less than about 2.4.

Another advantage of the materials listed that may be used for the second dielectric material 114 is that etch chemistries used to etch the second dielectric material 114 do not etch the first dielectric material 112. For example, the etch process for the second dielectric material 114 typically comprises a RIE using $N_2H_2$ or $N_2O_2$ plasmas, as examples. Because these etch chemistries do not remove or etch the first dielectric material 112, a natural etch stop on the first dielectric material 112 is created. This allows scaling the RIE processes to smaller dimensions, because over-etching the second dielectric material 114 will not affect the first dielectric material 112.

Advantageously, the organic materials that may be used for the second dielectric material 114 are typically etched with strip-type chemistries similar to the plasma strip processes used to remove photoresist, for example. The inorganic materials of the first dielectric material 112 typically are etched with a fluoropolymer-based chemistry. Therefore, the etch processes and materials provide a natural etch step so that the etching of the second dielectric material 114 stops when the first dielectric material 112 is reached. End-pointing of the etch processes is made easier, and over-etching into the first dielectric material 112 is made possible because of the high etch selectivity of the second dielectric material 114 and the first dielectric material 112. Therefore, a timed etch need not be relied upon to etch a second pattern, e.g., for conductive lines, in the second dielectric material 114.

In an alternative embodiment, the first dielectric material 112 may comprise an organic dielectric material, and the second dielectric material 114 comprises an inorganic dielectric material such as the organic and inorganic dielectric materials listed as examples, above. To achieve the etch selectivity between the first and second dielectric materials 112 and 114, preferably, one of the first dielectric material 112 or second dielectric material 114 comprises an organic dielectric material, and the other of the second dielectric material 114 or first dielectric material 112 comprises an inorganic dielectric material.

A hard mask 118 is deposited over the second dielectric material 114. The hard mask 118 preferably comprises a tri-layer and may alternatively comprise two or more mask layers, for example. The multi-layered hard mask stack 118 provides etch profile control and selectivity, acts as a CMP-stop and a barrier to prevent photoresist poisoning, and provides an enhanced lithographic process window for the depth of focus, to be described further herein. The thickness of the hard mask 118 preferably may be tuned to the required CMP stop thickness (for the CMP process that will be used to remove excess conductive material from the top surface of the second dielectric material 114 after the damascene structure is filled, to be described further herein). For example, the hard mask 118 preferably comprises a first mask layer 120, a second mask layer 126 formed over the first mask layer 120, and a third mask layer 128 formed over the second mask layer 126. The thickness of the mask layers 120, 126 and 128 may be altered to attain a CMP stop without sacrificing any material properties of the mask layers 120, 126 or 128 in accordance with an embodiment of the present invention. After the CMP process, it may be desirable to leave a portion of at least the first mask layer 120 disposed over the second dielectric material 114, which may comprise a porous material, to prevent the ingress of water and CMP slurry into the pores of the second dielectric material 114, for example.

The hard mask 118 preferably comprises a first mask layer 120 comprising silicon carbide ($SiC_x$). The first mask layer 120 in one embodiment comprises a first layer of $SiC_x$ (such as BLOk™ manufactured by Applied Materials) and a second layer of nitrogen-doped $SiC_x$ or N—$SiC_x$ (such as n-BLOk™ manufactured by Applied Materials) formed over the first layer of $SiC_x$. The $SiC_x$ layer may comprise a thickness of between about 350 to 1000 Angstroms, and the N—$SiC_x$ layer may comprise a thickness of about 500 Angstroms or less, as examples. In another embodiment, the first mask layer 120 comprises a unitary low-k hard mask material that also serves as a CMP-stop material, comprising a material such as $SiC_xH_y$, $SiCOH_x$, $SiC_xN_yH_z$ or $SiN_xH_y$, as examples. The low-k unitary hard mask may comprise a thickness of between about 100 Angstroms to 1000 Angstroms, as example. The first mask layer 120 provides a tunable CMP-stop window and enhances the RIE process window by eliminating micro-masking effects.

The hard mask 118 preferably comprises a second mask layer 126 disposed over the first mask layer 120. The second mask layer 126 preferably comprises $Si_3N_4$ or $SiO_2$, as examples. The second mask layer 126 is preferably deposited by CVD and may comprise a thickness of about 150 to 500 Angstroms, for example. The second mask layer 126 protects the underlying films 124, 122, 114, and 112 from photoresist rework-induced damage. Photoresist rework may be required when trying to print a pattern. If there is misalignment after patterning the photoresist, the photoresist is removed, and then a fresh layer of photoresist is deposited and the patterning process is repeated, to attempt to obtain a better alignment. The strip processes used may comprise $O_2$ plasma, $N_2$ plasma, or $H_2$ plasma, as examples. In particular, the second mask layer 126 prevents damage to the second dielectric material 114 and first dielectric material 112 from the plasma strip processes during rework.

The hard mask 118 includes a third mask layer 128 disposed over the second mask layer 126. The third mask layer 128 preferably comprises a refractory metal nitride, such as $TaN_x$ as an example, although other materials may be used. The third mask layer 128 may be deposited by CVD for example, and may comprise a thickness of 300 Angstroms or less. The third mask layer 128 provides an improved depth of focus window for the lithography processes of the dual damascene structure 100. The third mask layer 128, in combination with the second mask layer 126, prevents photoresist poisoning of subsequently-deposited photoresist 132. The third mask layer 128 also provides a higher etch selectivity to the organic and inorganic dielectric material (e.g. dielectric materials 112 and 114) etch processes. For example, a fluorocarbon-based etch affects TaN very slowly.

The third mask layer 128 functions as a line template in the present partial-via dual damascene patterning process. In particular, a photoresist (not shown in FIG. 1) is deposited over the third mask layer 128, and the photoresist is patterned with a pattern 134 for second conductive lines that will be formed in the second dielectric material 114, in a second metallization (M2) layer. The second conductive line pattern 134 is transferred to the third mask layer 128, using photolithography, as shown (e.g. by etching the third mask layer 128 using the patterned photoresist as a mask). Note that a top portion, e.g., less than about 100 Angstroms, of the second mask layer 126 may be removed while transferring the second conductive line pattern 134 to the third mask layer 128, as shown.

In one embodiment, the combination of the third mask layer 128 and second mask layer 126 prevents photoresist poisoning which typically would present a problem when SiCOH type materials are used for an insulating material. Advantageously, both the first dielectric material 112 and the second dielectric material 114 are separated from the photoresist 132 by the multi-layer hard mask 118. Therefore, if SiCOH-type materials are used for either the first dielectric material 112 or the second dielectric material 114, photoresist poisoning does not occur, in accordance with embodiments of the present invention.

An antireflective coating (ARC) 130 is deposited over the hard mask 118, as shown in FIG. 1. The ARC 130 comprises an organic or inorganic ARC commonly used to prevent reflection during a lithography process, and comprises a thickness of about 500 to 1500 Angstroms, for example. A photoresist 132 is deposited over the ARC 130. The photoresist 132 is patterned with the pattern for vias 136, as shown. The via pattern 136 will be transferred to the first dielectric material 112 of the second insulating layer 110, and the second conductive line pattern 134 will be transferred to the second dielectric material 114 of the second insulating layer 110, shown and described herein with reference to FIGS. 3–9.

FIG. 2 is a flow chart 140 for patterning a semiconductor device 100 using the dual damascene method described herein. FIGS. 3 through 10 show cross-sectional views of a semiconductor device 100 at various stages of manufacturing in accordance with an embodiment of the present invention. The formation of a dual damascene structure in accordance with a preferred embodiment of the present invention by patterning the various layers of the dual damascene stack 100 shown in FIG. 1 will next be described, with reference to the flow chart in FIG. 2 and FIGS. 3–10.

The process flow begins with the dual damascene structure 100 of FIG. 1. FIG. 3 shows a cross-sectional view of the dual damascene structure 100 shown in FIG. 1. The second conductive line pattern 134 has been formed in the third mask layer 128 of the hard mask. The via pattern 136 has been formed in the photoresist 132.

Figure 4:
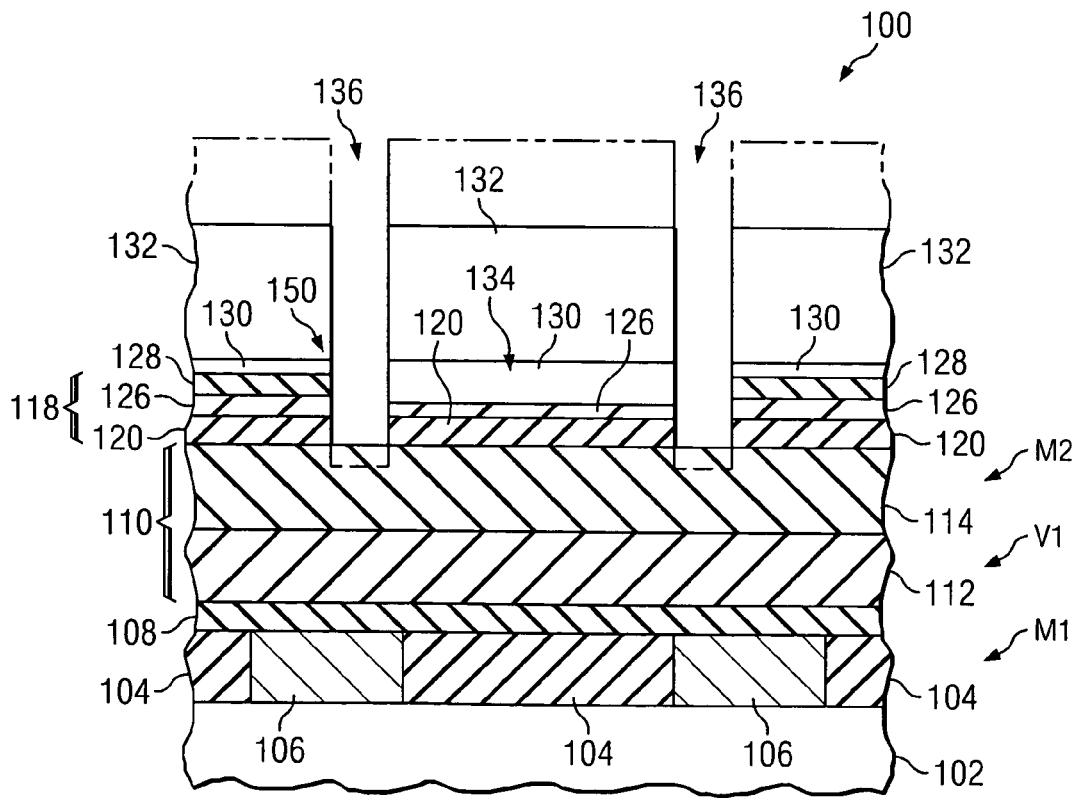

The semiconductor device is subjected to a "via mask open" step 142 (FIG. 2), as shown in FIG. 4. The via mask open step 142 preferably comprises a non-selective etch of the ARC 130 and all layers 128, 126 and 120 of the hard mask 118, for example. Optionally, a top portion of the second dielectric material 114 may be removed during the via mask open step, as shown in phantom. Note that a top portion of the photoresist 132 may also be removed during the via mask open.

An advantage of using a non-selective etch for the via mask open is that any misalignment (e.g. by a distance d at 160 in FIG. 3) of the conductive line pattern 134 is opened (e.g., etched away) and removed, as shown in FIG. 4. Another advantage of using a non-selective etch for the via mask open is that striations of the sidewalls of the vias may be prevented or minimized. Striations can cause star-shaped vias (rather than round vias, as is often desired), which can lead to shorting of adjacent vias in subsequent processing steps.

The via mask open may comprise a single step process, stopping in the second dielectric material 114, or alternatively it may comprise a two step process with selectivity to the first mask layer 120 in the first step, and a first mask layer 120 only etch as part of the second step, for example.

In one embodiment, the etch chemistry of the via mask open comprises $O_2$ gas with a flow rate ranging from about 10 to 100 standard cubic centimeters per minute (sccm), $CF_4$ gas with a flow rate ranging from about 10 to 200 sccm, and $CH_2F_2$ gas with a flow rate ranging from about 0 to 50 sccm diluted in an inert gas such as Ar for about 10 seconds to 2 minutes, for example. The pressure for the via mask open may range from about 20 to 300 mTorr, with an electrode plasma power density ranging from about 1 W/cm$^2$ to 10 W/cm$^2$, and the bias power density ranging from about 0.1 W/cm$^2$ to 10 W/cm$^2$. Alternatively, other etch chemistries, pressures, power density levels and times may be used for the via mask open, for example.

Figure 5:
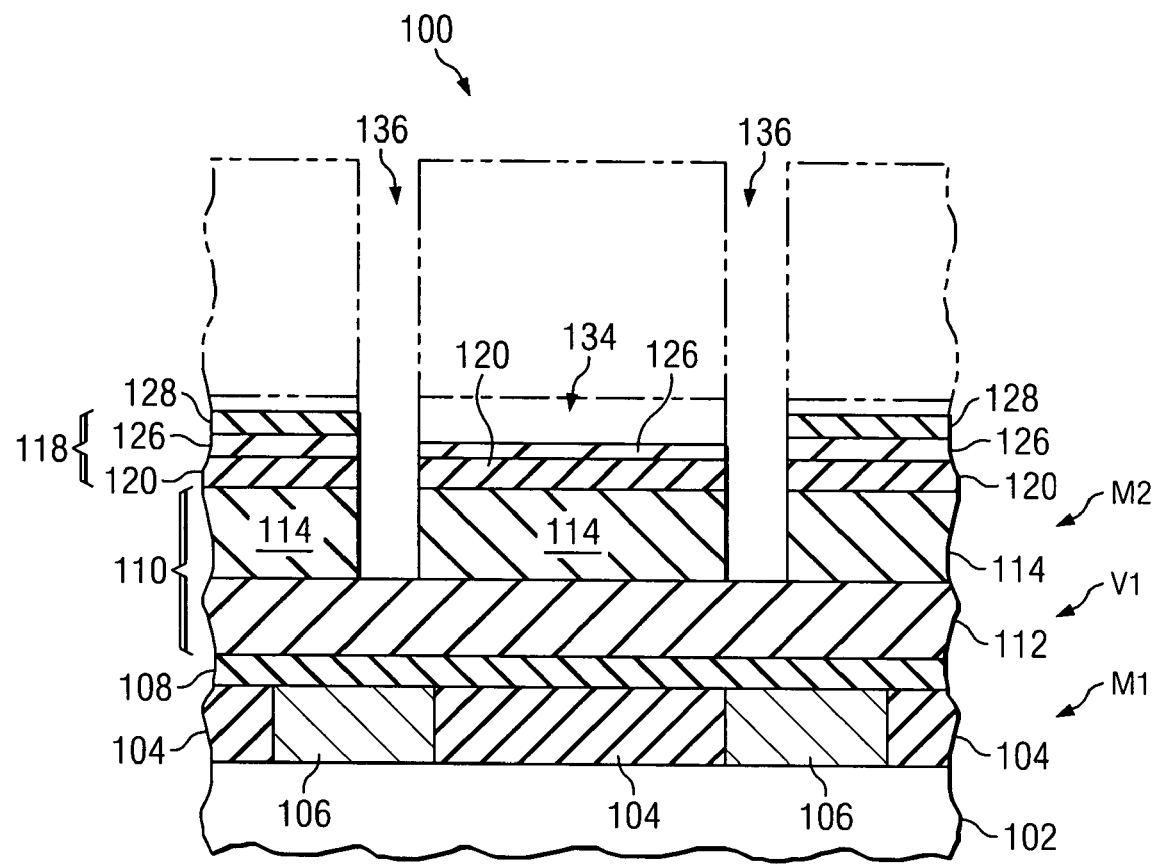

The next processing step comprises a partial via step 144 (FIG. 2) as shown in FIG. 5. In the partial via step, the via pattern 136 from the photoresist 132 is transferred to the second dielectric material 114 or M2 metallization level of the second insulating layer 110. In particular, exposed portions of the second dielectric material 114 are etched while portions of the second dielectric material 114 protected by the hard mask 118 are not etched. In the partial via step, the photoresist is preferably simultaneously removed from the top surface of the wafer, as shown in FIG. 5. The partial via etch may be endpointed so that the etch stops when the photoresist 132 is completely removed, for example. Because the etchant chemistries do not etch the first dielectric material 112, the etch stops on the first dielectric material 112, and the etch may be continued until the photoresist 132 is completely removed, leaving the conductive line pattern 134 of the hard mask 118 exposed. The partial via step is preferably selective to the third mask layer 128, the second mask layer 126, and the first dielectric material 112, in one embodiment.

The etch chemistry for the partial via step in one embodiment comprises $N_2$ gas with a flow rate ranging from about 100 to 1000 sccm, $O_2$ gas with a flow rate ranging from about 0 to 50 sccm, and $H_2$ gas with a flow rate ranging from about 0 to 500 sccm for about 15 seconds to 2 minutes, as an example. The pressure regime may range from about 20 to 300 mTorr, with an electrode source power density ranging from about 1 W/cm$^2$ to 10 W/cm$^2$, and a bias power density of about 2 W/cm$^2$ or less, as examples. Alternatively, other etch chemistries, pressures, power density levels and times may be used for the partial via step, for example.

Preferably, the partial via step is optimized to ensure complete removal of all of the exposed second dielectric material 114 and photoresist 132, while not producing sputter damage of the underlying first dielectric material 112. Excessive overetch in this step can lead to the deposition of oxide on via walls which can affect via diameter and/or affect device reliability and performance. The overetch component in the partial via step may range from about 0% to 200% of the time required to clear the second dielectric material 114 and photoresist 132, as an example.

Figure 6:
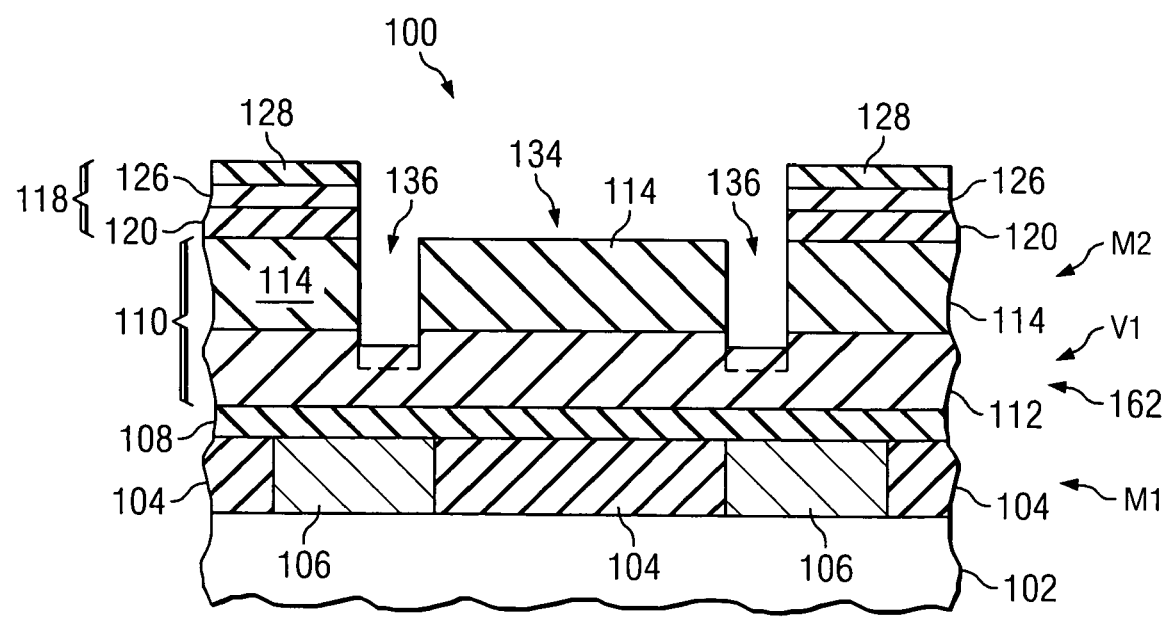

The next processing step comprises a trough open step 146, (FIG. 2) as shown in FIG. 6. The purpose of this step is to begin the transfer of the conductive line pattern 134 of the third mask layer 128 of the hard mask 118. The remaining portions of the third mask layer 128 are used as a mask to remove the second mask layer 126 and first mask layer 120 in the conductive line pattern 134. Therefore, the trough open etch process is preferably selective to the third mask layer 128. Note that a top portion of the first dielectric material 112 may be removed in the trough open step, as shown in phantom in FIG. 6 at 162. Preferably, in the trough open etch, all traces of the first mask layer are removed, while maintaining a high degree of selectivity to underlying second dielectric material 114.

In one embodiment, the trough open step comprises an etch chemistry of $O_2$ gas with a flow rate ranging from about 10 to 50 sccm, $CF_4$ gas with a flow rate ranging from about 0 to 50 sccm, and $CH_2F_2$ gas with a flow rate of about 50 sccm or less, diluted in an inert gas such as Ar for about 10 seconds to 1 minute, for example. The pressure regime may range from about 50 to 150 mTorr, with an electrode power density ranging from about 1 W/cm$^2$ to 10 W/cm$^2$, and a bias power density of about 2 W/cm$^2$ or less, as examples. Alternatively, other etch chemistries, pressures, power density levels and times may be used for the trough open step, for example.

Figure 7:
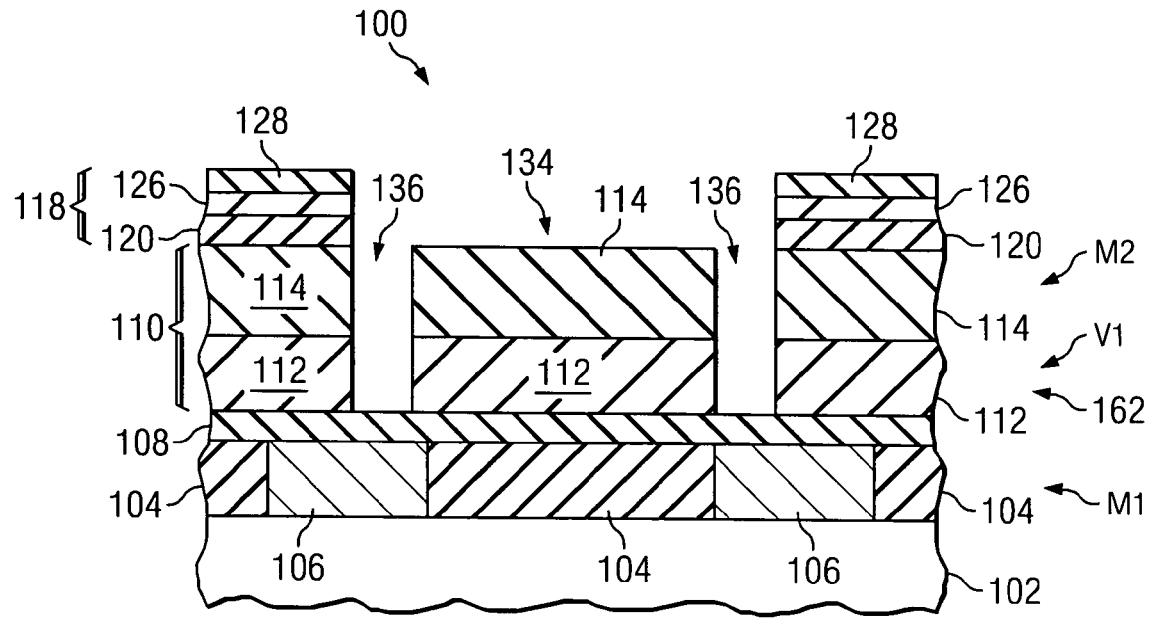

The next processing step comprises an oxide via etch step 148 (FIG. 2), as shown in FIG. 7. In the oxide via etch step, the via pattern 136 as defined in the partial via step is transferred through the first dielectric material 112 (which may comprise oxide) of the V1 level. The via etch step is preferably selective to the hard mask 118 and the second dielectric material 114 that is exposed in the trough areas at the sidewalls of the patterns 134 and 136. The via etch step is also preferably selective to the underlying cap layer 108, which functions as an etch stop layer and diffusion barrier.

An etch chemistry for the oxide via etch step in one embodiment comprises $O_2$ gas with a flow rate ranging from about 10 to 50 sccm, $CF_4$ gas with a flow rate ranging from about 5 to 50 sccm, CO gas with flow rate of about 200 sccm or less, $C_4F_6$ gas with a flow rate ranging from about 1 to 20 sccm, diluted in an inert gas such as Ar for about 10 seconds to 2 minutes, for example. The pressure regime may range from about 30 to 100 mTorr, with an electrode plasma power density and bias power density of about 10 $W/cm^2$ or less, as examples. Alternatively, other etch chemistries, pressures, power density levels and times may be used for the oxide via etch step, for example.

Figure 11:
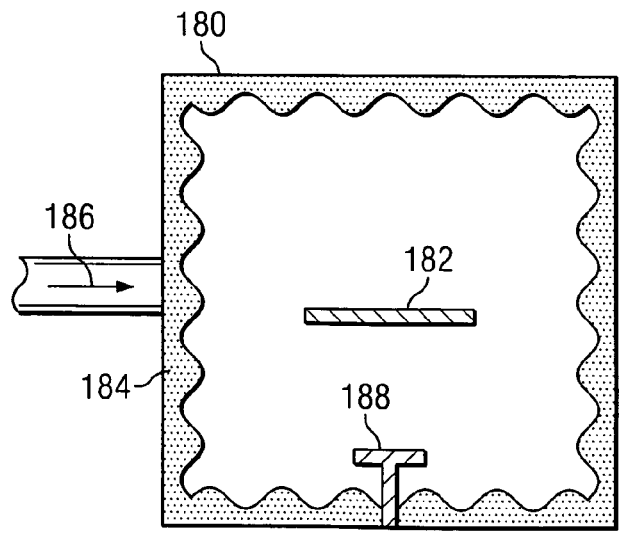
FIG. 11 shows a chamber for processing semiconductor wafers in which polymers deposited on the chamber walls during the etching of inorganic material layers are cleaned or removed in-situ while a semiconductor wafer remains in the wafer in accordance with an embodiment of the present invention.

The oxide via etch step may be heavily polymerizing, forming polymers 184 on the interior surfaces of the processing chamber 180 for the semiconductor device 100, as shown in FIG. 11. Continuing to process the semiconductor device 100 would result in polymers being removed from the chamber walls and forming aggressive reactant species that would chemically attack the hard mask 118, which would degrade the fabrication process and lead to device failures. Thus, at this point in the manufacturing process flow, either the processing chamber is cleaned while the wafer remains in the chamber (the in-situ chamber clean step 150 of FIG. 2), or the wafer is moved to a clean second processing chamber (step 152 of FIG. 2).

The novel in-situ chamber cleaning process of a semiconductor wafer in accordance with an embodiment of the present invention will next be described, with reference to FIG. 11. The in-situ chamber cleaning process is a method of cleaning a chamber 180 that has been used to etch inorganic materials in semiconductor device fabrication, wherein the chamber has polymer build-up 184 on the interior walls thereof. The method includes, without removing a semiconductor wafer 182 that has been processed in the chamber 180, introducing a plasma cleaning gas 186 into the chamber 180 to remove the polymer build-up 184 on the chamber walls without etching any material layers of the semiconductor wafer 182. In one embodiment, the plasma cleaning gas 186 comprises a gas comprising $O_2$ gas diluted in Ar, He or $N_2$. The $O_2$ concentration may comprise about 1% to 20% of the gas flow ratio, for example. Alternatively, the plasma cleaning gas 186 may comprise other chemistries, for example. The method may further include applying power only to an electrode 188 in the chamber during cleaning, and not biasing the wafer during the cleaning method. The plasma electrode power density applied may comprise about 0.1 $W/cm^2$ to 10 $W/cm^2$ at a pressure of about 50 mTorr to 500 mTorr, for example. In particular, preferably a hard mask (such as hard mask 118 of FIG. 1) formed on the semiconductor wafer 182 is not etched or removed during the cleaning method. In the cleaning process, any CF species that have formed on the interior walls of the chamber are converted to CN, CO or HF, as examples, which are then pumped out of the chamber (not shown).

Figure 8:
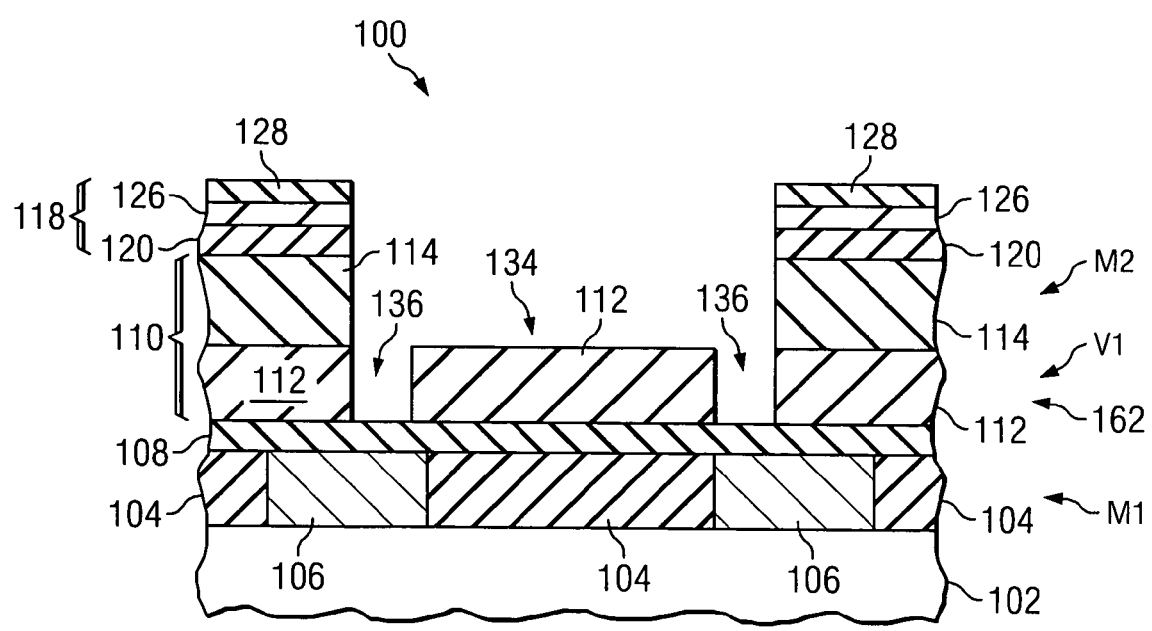

Next, after either cleaning the processing chamber 180 (FIG. 11) or moving the workpiece 102 to a clean processing chamber, a trough etch step 153 (FIG. 2) is then performed, as shown in FIG. 8. In the trough etch step, the second dielectric material 114 remaining in the trough or conductive line pattern 134 is selectively etched, with selectivity to the hard mask 118, the cap layer 108 and the first dielectric material 112. Preferably, the hard mask 118, cap layer 108, and first dielectric material 112 structures are defined in such a way as to ensure conductive line level dimensional control by maintaining a high degree of selectivity to the first conductive lines 106 which function as an etch stop layer. Also, preferably the degree of selectivity is such that the resulting etched structure is free of "grass" and other organic/inorganic residues, which could negatively affect device reliability performance. For these reasons, the trough etch step may comprise a single etch step or may comprise two or more etch steps.

In one embodiment, the trough etch step comprises an etch chemistry of $N_2$ gas with a flow rate ranging from about 100 to 1000 sccm, $O_2$ gas with a flow rate of about 50 sccm or less, $H_2$ gas with a flow rate of about 500 sccm or less for about 10 seconds to 2 minutes, for example. The pressure regime may range from about 20 to 150 mTorr, with an electrode plasma power density ranging from about 1 $W/cm^2$ to 10 $W/cm^2$, and a bias power density of about 2 $W/cm^2$ or less, as examples. Alternatively, other etch chemistries, pressures, power density levels and times may be used for the trough etch step, for example.

Figure 9:
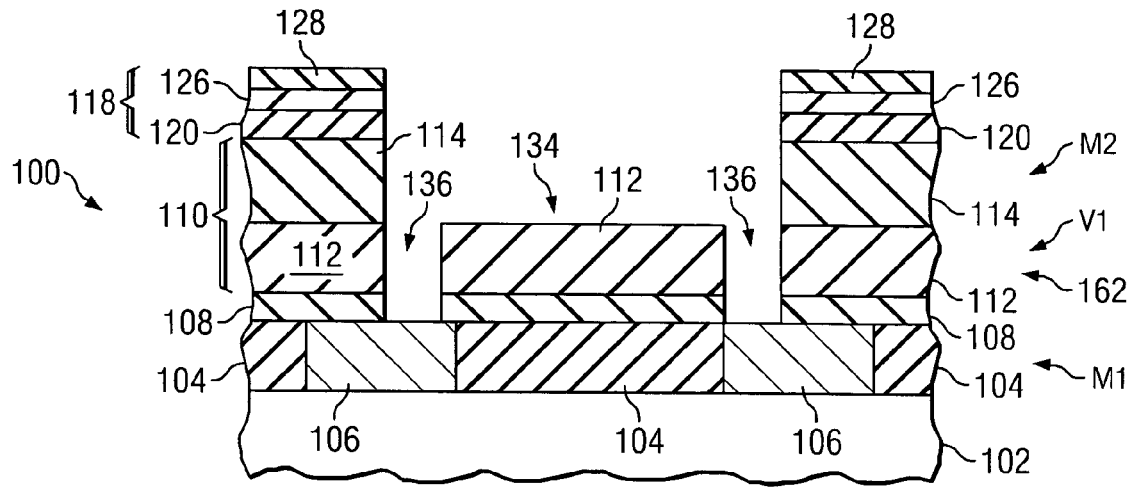

At this point in the manufacturing process flow, the conductive line pattern 134 has been formed in the second dielectric material 114 of the second insulating layer 110, and the via pattern 136 has been formed in the first dielectric material 112 of the second insulating layer 110. Next, the cap layer 108 must be opened so that the vias will make electrical contact to the underlying first conductive lines 106. Therefore, the next processing step comprises a finish etch step 154 (FIG. 2), as shown in FIG. 9, in which the cap layer 108 is opened at the bottom of the via pattern 136. The finish etch preferably comprises an etch selective to the hard mask 118 and the exposed first dielectric material 112.

The finish etch may comprise $O_2$ gas with flow rate of about 50 sccm or less, $CF_4$ gas with flow rate of about 50 sccm or less, $N_2$ gas with a flow rate of about 300 sccm or less, $CHF_3$ gas with flow rate of about 30 sccm or less, and $CH_2F_2$ gas with flow rate of about 40 sccm or less, diluted in an inert gas such as Ar, for about 5 seconds to 30 seconds, as an example. The pressure regime may range from about 50 to 150 mTorr, with an electrode plasma power density ranging from about 1 $W/cm^2$ to 10 $W/cm^2$, and a bias power density of about 2 $W/cm^2$ or less, as examples. Alternatively, other etch chemistries, pressures, power and times may be used for the finish etch step, for example.

A de-fluorination clean step 156 (FIG. 2) is also shown in FIG. 9. In the de-fluorination clean step, any fluorinated organic species which may be absorbed to the wafer, conductive line pattern 134 sidewalls or via pattern 136 sidewalls are removed using a reducing plasma, for example. In one embodiment, the etch chemistry for the de-fluorination clean step comprises $N_2$ gas with a flow rate ranging from about 100 to 1000 sccm and $H_2$ gas with a flow rate of about 500 sccm or less for about 5 to 30 seconds, as an example. The pressure regime may range from about 100 to 150 mTorr, with an electrode plasma power density ranging from about 1 $W/cm_2$ to 10 $W/cm_2$, and a bias power density ranging from about 2 $W/cm_2$ or less, as examples. Alternatively, other etch chemistries, pressures, power and times may be used for the de-fluorination clean step, for example.

Figure 10:
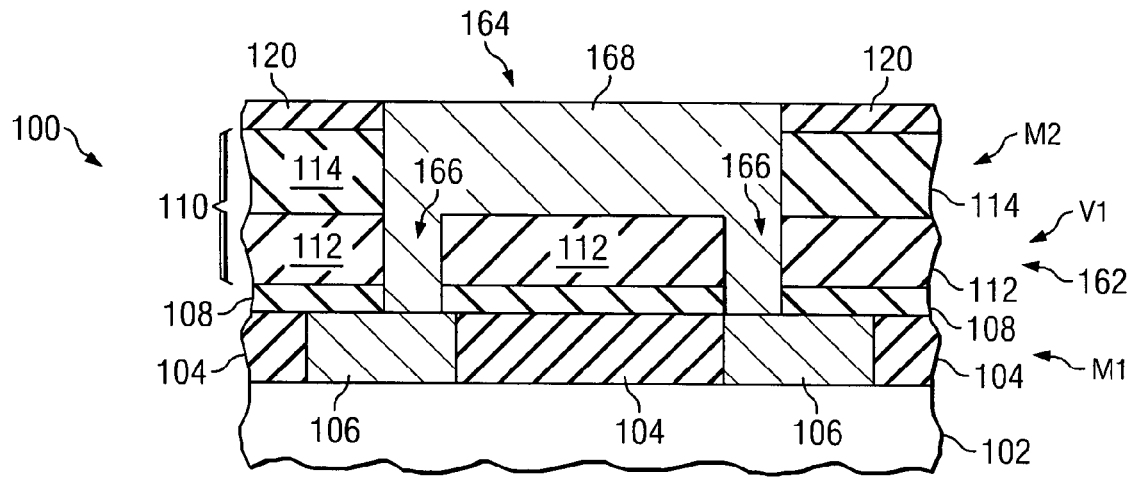

Next, a conductive material 164 is deposited over the patterned second dielectric material 114 and the patterned first dielectric material 112, as shown in FIG. 10. The conductive material 164 is removed from the top surface of the second dielectric material, e.g., using a CMP process, leaving conductive material 164 in the via pattern 136 and conductive line pattern 134 to form vias 166 and conductive lines 168, respectively. Note that although not shown in FIG. 10, a portion of the hard mask 118 may remain residing over the top surface of the second dielectric material 114 of the second insulating layer 110 after the CMP process.

Advantages of embodiments of the present invention include providing an insulating layer 110 for a dual damascene process and structure, in which the different materials of the dielectric layers 112 and 114 creates a natural etch stop. This results in improved RIE write profiles and the ability to form features such as vias 166 with substantially vertical sidewalls, rather than being tapered as in prior art via formation. Conductive lines 168 having smaller critical dimensions may be obtained with the improved manufacturing control provided by the bi-layer insulating layer 110. The thickness and materials of the bottom mask layer 120 of the hard mask 118 are tunable for a particular application as a CMP stop layer. Photoresist poisoning during a dual damascene etch process is prevented with the use of embodiments of the present invention. The materials used in the various layers of the structure may be changed without impacting or affecting the remainder of the stack 100.

Advantages of the method of forming a dual damascene structure 100 according to an embodiment of the present invention include providing a dual damascene etch process that enables a dual damascene integration scheme. Modifications may be made to a specific component of the etch process to account for a material change in the via patterning etch process or the line patterning etch process, which does not affect the remainder of the etch scheme. The need for a timed etch to pattern the shallower conductive line pattern 134, which is difficult to control, is eliminated. The dual damascene process may be completed in a single chamber or alternatively in multiple chambers. A novel method of cleaning a chamber while the wafer remains in the chamber is also disclosed.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that the materials and processes described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor device, the method comprising:

disposing a workpiece in a processing chamber, disposing a first dielectric material over the workpiece, while said workpiece is in said processing chamber;

disposing a second dielectric material over the first dielectric material, the second dielectric material comprising a different material than the first dielectric material, wherein the first dielectric material and the second dielectric material comprise a first insulating layer;

depositing a hard mask over the second dielectric material, the depositing of said hard mask comprising depositing a first mask layer, depositing a second mask layer over said first mask layer and depositing a third mask layer over the second mask layer;

forming a first pattern in the first dielectric material;

cleaning the processing chamber while the workpiece remains in the processing chamber, and before removing any of the layers of the material on the workpiece;

forming a second pattern different from the first pattern in the second dielectric material wherein forming said patterns comprises;

patterning at least the third mask layer with the second pattern;

patterning the third mask layer, the second mask layer and the first mask layer with the first pattern;

transferring the first pattern to the second dielectric material;

removing the third mask layer, the second mask layer and the first mask layer in the second pattern regions;

transferring the first pattern to the first dielectric material; and removing the second dielectric material in the second pattern regions, subsequent to said step of cleaning.

2. The method according to claim 1, wherein the conductive lines comprise copper.

3. The method according to claim 1, wherein the second dielectric material comprises a top surface, further comprising:

depositing a conductive material over the patterned second dielectric material and the patterned first dielectric material; and removing the conductive material from the top surface of the second dielectric material.

4. The method according to claim 3, wherein removing the conductive material from the top surface of the second dielectric material comprises forming conductive lines in the second pattern of the second dielectric material.

5. The method according to claim 3, wherein the conductive material forms vias in the first pattern of the first dielectric material.

6. The method according to claim 5, wherein the vias comprise substantially vertical sidewalls.

7. The method according to claim 5, wherein the workpiece comprises component regions, wherein at least one of the vias makes electrical contact with a component region of the workpiece.

8. The method according to claim 6, wherein the workpiece component regions comprise a plurality of conductive lines formed in a dielectric layer.

9. The method according to claim 8, wherein the conductive lines comprise copper, wherein disposing the first dielectric material comprises disposing a material having a coefficient of thermal expansion (CTE) close to the CTE of the conductive lines.

10. The method according to claim 1, wherein depositing the first mask layer comprises depositing $SiC_x$, $SiC_xN_y$, $SiC_xH_y$, $SiC_xN_yH_z$, or SiCOH, wherein depositing the second mask layer comprises depositing $Si_xN_y$ or $SiO_2$, and wherein depositing the third mask layer comprises depositing a refractory metal nitride.

11. The method according to claim 10, wherein depositing the first mask layer comprises depositing a layer of $SiC_x$ and a layer of $N-SiC_x$ over the layer of $SiC_x$.

12. The method according to claim 1, wherein cleaning the processing chamber comprises introducing a plasma cleaning gas comprising $O_2$ gas diluted in Ar, He, or $N_2$, and wherein the plasma cleaning gas removes polymer build-up on the processing chamber walls.

13. The method according to claim 12, further comprising only applying power to an electrode in the chamber during cleaning, wherein the workpiece is not biased during the cleaning method, and wherein the plasma electrode power density applied comprises about 0.1 $W/cm^2$ to 10 $W/cm^2$ at a pressure of about 50 mTorr to 500 mTorr.

14. The method according to claim 1, further comprising:
depositing a cap layer over the workpiece, before disposing the first dielectric material; and
transferring the first pattern to the cap layer.

15. The method according to claim 14, further comprising forming an adhesion film over a top surface of the cap layer.

16. The method according to claim 1, further comprising forming an adhesion film disposed over a top surface of the first dielectric layer.

17. The method of claim 16, wherein the second dielectric material comprises a top surface, further comprising:
depositing a conductive material over the patterned second dielectric material and the patterned first dielectric material; and
removing the conductive material from the top surface of the second dielectric material.

18. The method according to claim 1, wherein forming the first pattern and the second pattern further comprises:
after patterning at least the third mask layer with the second pattern, depositing an anti-reflective coating over the third mask layer;
depositing a photoresist layer over the anti-reflective coating;
patterning the photoresist layer with the first pattern; and
transferring the first pattern in the photoresist layer to the third mask layer, the second mask layer, the first mask layer, and the second dielectric layer.

19. The method of claim 18, wherein removing the conductive material from the top surface of the second dielectric material to form comprises forming conductive lines in the second pattern of the second dielectric material.

20. The method according to claim 1, wherein disposing the first dielectric material comprises disposing an inorganic material, and wherein disposing the second dielectric material comprises disposing an organic material.

21. The method of claim 20, wherein the conductive lines comprise copper, wherein disposing the first dielectric material comprises disposing a material having a coefficient of thermal expansion (CTE) close to the CTE of the conductive lines.

22. The method according to claim 1, wherein disposing the first dielectric material comprises disposing a material that is etchable selective to the second dielectric material.

23. The method according to claim 1, wherein disposing the first dielectric material comprises disposing undoped silicate glass (USG), fluorinated silicon glass (FSG), fluorinated tetraethoxysilate (FTEOS), SiCOH, or porous-SiCOH, and wherein disposing the second dielectric material comprises disposing SiLK™ or porous-SiLK™.

24. A method of fabricating a semiconductor device, the method comprising:
disposing a workpiece in a processing chamber;
disposing a first dielectric material over the workpiece;
disposing a second dielectric material over the first dielectric material, the second dielectric material comprising a different material than the first dielectric material, and wherein the first dielectric material and the second dielectric material comprise a first insulating layer;
depositing a hard mask over the second dielectric material, the deposition of said hard mask comprising depositing a first mask layer, depositing a second mask layer over said first mask layer and depositing a third mask layer over the second mask layer;
forming a first pattern in the first dielectric material;
moving the workpiece to another processing chamber and then removing the second dielectric material to form a second pattern, said second pattern different form the first pattern; and
said steps of forming said first and second patterns comprising;
patterning at least the third mask layer with the second pattern;
patterning the third mask layer, the second mask layer and the first mask layer with the first pattern;
transferring the first pattern to the second dielectric material;
removing the third mask layer, the second mask layer and the first mask layer in the second pattern regions;
transferring the first pattern to the first dielectric material; and
removing the second dielectric material in the second pattern regions.

* * * * *